United States Patent
Zoll et al.

(10) Patent No.: US 9,437,498 B2
(45) Date of Patent: Sep. 6, 2016

(54) METHOD FOR THE FORMATION OF DIFFERENT GATE METAL REGIONS OF MOS TRANSISTORS

(71) Applicant: STMICROELECTRONICS (CROLLES 2) SAS, Crolles (FR)

(72) Inventors: Stéphane Zoll, Froges (FR); Philippe Garnier, Meylan (FR); Olivier Gourhant, Goncelin (FR); Vincent Joseph, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/636,778

(22) Filed: Mar. 3, 2015

(65) Prior Publication Data

US 2015/0262884 A1    Sep. 17, 2015

(30) Foreign Application Priority Data

Mar. 14, 2014  (FR) ..................................... 14 52130

(51) Int. Cl.
| | |
|---|---|
| *H01L 21/3205* | (2006.01) |
| *H01L 21/8234* | (2006.01) |
| *H01L 29/49* | (2006.01) |
| *H01L 21/324* | (2006.01) |
| *H01L 21/033* | (2006.01) |
| *H01L 21/28* | (2006.01) |

(52) U.S. Cl.
CPC ... *H01L 21/823437* (2013.01); *H01L 21/0332* (2013.01); *H01L 21/28088* (2013.01); *H01L 21/324* (2013.01); *H01L 29/4966* (2013.01)

(58) Field of Classification Search
None
See application file for complete search history.

(56) References Cited

U.S. PATENT DOCUMENTS

| | | | |
|---|---|---|---|
| 2005/0048722 A1* | 3/2005 | Saito | H01L 21/823842 438/275 |
| 2007/0054446 A1* | 3/2007 | Chambers | H01L 21/823842 438/197 |
| 2007/0105317 A1 | 5/2007 | Nakajima | |
| 2010/0244141 A1 | 9/2010 | Beyer | |
| 2010/0301427 A1 | 12/2010 | Lenski | |
| 2012/0129331 A1 | 5/2012 | Choi | |

\* cited by examiner

*Primary Examiner* — Daniel Whalen
(74) *Attorney, Agent, or Firm* — Allen, Dyer, Doppelt, Milbrath & Gilchrist, P.A.

(57) ABSTRACT

A method is for forming at least two different gates metal regions of at least two MOS transistors. The method may include forming a metal layer on a gate dielectric layer; and forming a metal hard mask on the metal layer, with the hard mask having a composition different from that of the metal layer and covering a first region of the metal layer and leaving open a second region of the metal layer. The method may also include diffusion annealing the intermediate structure obtained in the prior steps such as to make the metal atoms of the hard mask diffuse into the first region, and removal of the hard mask.

15 Claims, 2 Drawing Sheets

METHOD FOR THE FORMATION OF DIFFERENT GATE METAL REGIONS OF MOS TRANSISTORS

FIELD OF THE INVENTION

The invention relates to integrated circuits, and, in particular, to the formation of gate metal regions of MOS transistors.

BACKGROUND

The gates of a MOS transistor may be formed by depositing a layer of dielectric on a semiconductor substrate, and by covering this layer of dielectric with a stack of layers containing a metal layer. Etching steps are subsequently implemented for bounding the gates of the transistors within the multilayer thus formed.

The physical-chemical composition of the gate metal regions varies depending on the type of conduction and on the desired threshold voltage for the MOS transistor. In other words, a transistor of the N type and a transistor of type P comprise metal layers having different physical-chemical compositions.

Currently, the formation of these different metal gates comprises steps for deposition of different metal layers associated with steps for etching into these layers leading, for some of them, to opening up the layer of underlying dielectric.

However, etching away a metal layer with an endpoint on a portion of gate dielectric layer may damage this gate dielectric layer. A damaged gate dielectric layer may lead to electrical leakage between the gate region of a transistor and the underlying regions of this transistor.

SUMMARY

According to one embodiment, different metal regions of gates of MOS transistors are formed without damaging the gate dielectric layer of these transistors.

According to one aspect, a method is provided for forming at least two different gate metal regions of at least two MOS transistors comprising: a) forming a metal layer on a gate dielectric layer; b) forming a metal hard mask on the metal layer, the hard mask having a composition different from that of the metal layer and covering a first region of the metal layer and leaving open a second region of the metal layer; c) diffusion annealing the intermediate structure obtained in step b) in such a manner as to make the metal atoms of the hard mask diffuse into the first region; and d) removing the hard mask, for example by a chemical etch process.

Thus, the first region of the metal layer is a region having a physical-chemical composition different from that of the second region of the metal layer, since it comprises atoms coming from the hard mask. The layer of dielectric is furthermore not opened because it still remains covered by the metal layer that protects it.

At least two stacks of gate dielectric layers and of a gate metal layer have desired and different physical-chemical compositions, in which the layer of dielectric has not been damaged. This results in two different MOS transistors being obtained in which the risk of leakage occurring through the gate is low.

The annealing step can be a rapid thermal annealing by a gas comprising nitrogen. Such an annealing allows metal atoms to be diffused to obtain the desired electrical characteristics. In addition, by using a gas comprising nitrogen, and in particular a gas which does not comprise any oxygen, the oxidation of the metal layer of the second region, which is not protected by the hard mask, is avoided. Ammonia ($NH_3$) may, for example, be used as process gas.

The parameters of the anneal can be chosen by those skilled in the art depending on the application. In particular, the duration and the temperature of the anneal can be chosen to allow a good diffusion of the metal, depending notably on the materials used which do not all diffuse in the same way. The rapid thermal annealing preferably has a duration in the range between 1 second and 5 minutes, and the temperature of the anneal is preferably in the range between 400° C. and 1200° C.

The metal layer may comprise titanium nitride.

Finally, the hard mask can comprise a metal selected from the group consisting of aluminum, chrome, manganese, molybdenum, tungsten, tantalum, rhenium, ruthenium, cobalt, nickel, lanthanum, or an oxide of a metal from the group or a nitride of a metal from the group.

It may be noted that certain metals, for example aluminum, are particularly well adapted to the formation of transistors of the PMOS type.

BRIEF DESCRIPTION OF THE DRAWINGS

Other advantages and features of the invention will become apparent upon studying the detailed description of embodiments, taken by way of non-limiting examples and illustrated by the appended drawings in which.

DETAILED DESCRIPTION OF THE EMBODIMENTS

Figure 1:
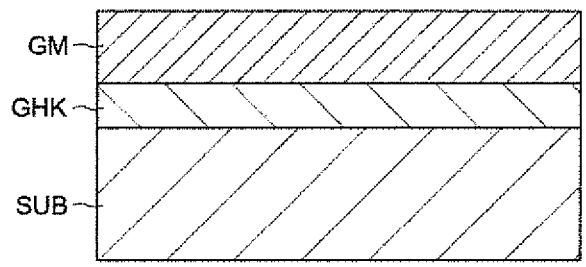
FIGS. 1 to 6 are each schematic cross sectional views in a sequence illustrating a method according to one embodiment of the invention.

In FIG. 1, a multilayer is shown comprising a substrate SUB, a gate dielectric layer GHK, and a gate metal layer GM which has been formed in a conventional manner, for example, by deposition.

The substrate SUB can be a semiconductor wafer made of silicon ("bulk" substrate), or a substrate of silicon-on-insulator (or SOI) to obtain transistors with fully-depleted channel (FDSOI: Fully Depleted Silicon On Insulator). Thus, some of the steps implemented in the method described hereinafter are steps referred to as "full wafer".

The gate dielectric layer GHK can comprise a layer of silicon dioxide and a layer of material with a high dielectric constant (known as High-k dielectric). This gate dielectric layer GHK can have a thickness in the range between 10 and 30 Angstroms, and it is this layer that should be protected while fabrication steps are implemented above this layer.

The gate metal layer GM may comprise titanium nitiride (TiN), and its thickness can be on the order of a few Angstroms to a few tens of Angstroms, for example,e 50 Angstroms. The gate metal layer can furthermore comprise lanthanum (La). It is in this layer that the metal regions having different characteristics will be formed.

Figure 2:
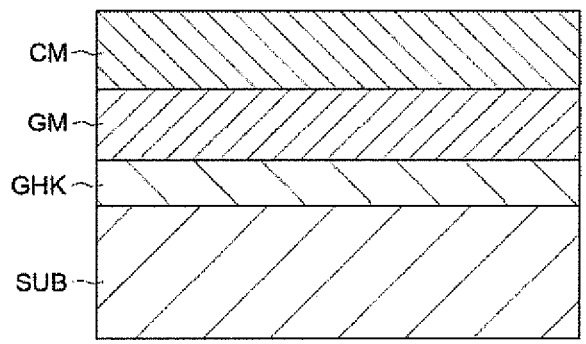

As illustrated in FIG. 2, a layer of metal material CM comprising another metal material than that of the gate metal layer GM, for example aluminum, may be formed on the gate metal layer GM, for example, by a physical vapor deposition (PVD deposition). This layer comprises atoms intended to be diffused into certain regions of the gate metal layer GM. The thickness of the layer of material CM can be in the range between 10 Angströms and 100 Angströms, for example, 50 Angströms.

Figure 3:
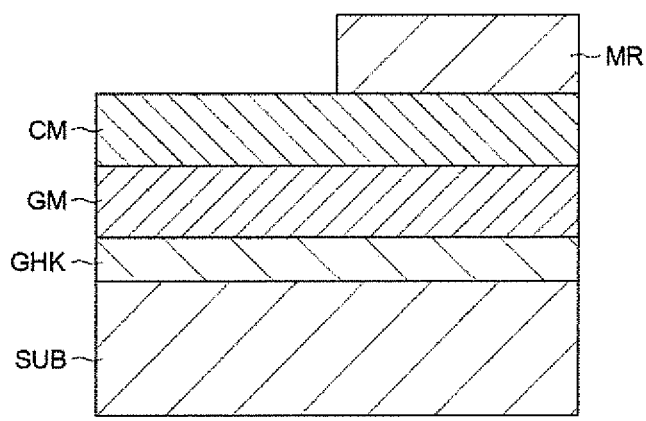

In order to bound regions into which atoms will be diffused, a photolithography step may be implemented, as illustrated in FIG. 3, in which a photoresist mask MR has been formed on top of the layer of material CM.

Figure 4:
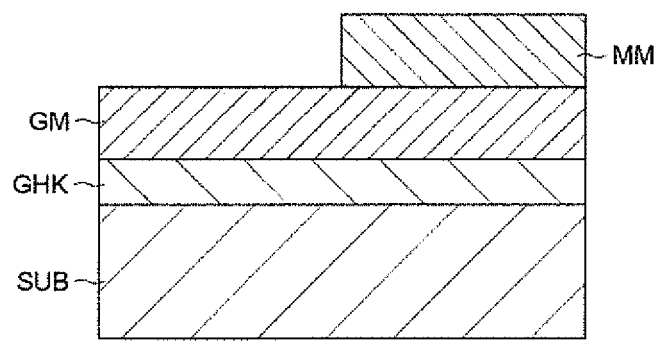

The formation of the resist mask MR is followed by a step for etching of the layer CM in which the portions of the layer which are not protected by the resist mask MR (FIG. 4) are removed. A metal hard mask MM is thus obtained. The etch step can be implemented by wet etching using hydrochloric acid (HCl). It may be noted that this etch is implemented while the gate dielectric layer GHK is well protected by the gate metal layer GM.

Figure 5:
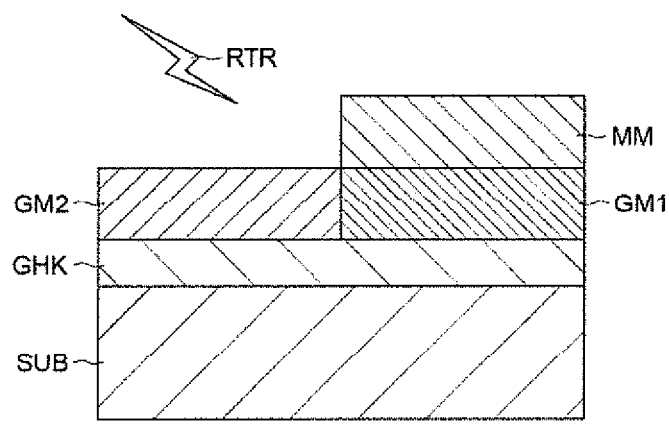

A step for rapid thermal annealing can subsequently be implemented, as indicated in FIG. 5 by the reference RTR. This rapid thermal annealing step makes metal atoms diffuse from the hard mask into the gate metal layer GM, and two regions of the gate metal layer are thus obtained having different electrical characteristics, namely: a first region of the metal layer GM1 comprising, in this example, atoms of aluminum, and a second region of the metal layer GM2 having a composition that is unchanged with respect to the gate metal layer CM.

According to one variant, the rapid thermal annealing step may be carried out in the presence of ammonia ($NH_3$) or of any other gaseous mixture capable of nitriding the gate metal layer in the second region GM2 of the metal layer GM. Increasing the nitrogen (N) concentration of the gate metal layer allows, notably in the case where it comprises titanium nitiride (TiN), a treatment to be obtained which renders it usable as a gate material for transistors of the NMOS type.

Figure 6:
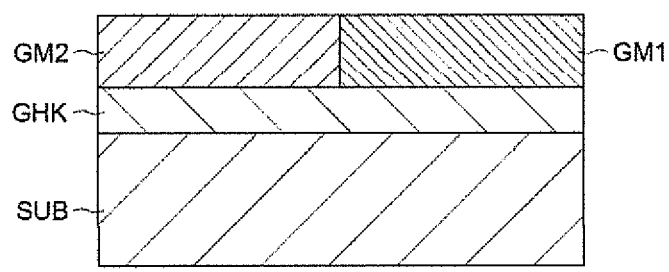

As illustrated in FIG. 6, the metal hard mask MM can subsequently be selectively removed with respect the gate metal layer GM, for example, by a chemical etch process.

In these examples, the multilayer comprising the gate dielectric layer GHK and the first region of the metal layer GM1 is particularly well adapted for forming gates of transistors of the PMOS type, whereas the multilayer comprising the gate dielectric layer GHK and the second region of the metal layer GM2 is particularly well adapted for forming transistor gates of the NMOS type.

The multilayers may for example be completed by a formation of polycrystalline silicon on the metal layer.

It is subsequently possible to implement steps for bounding gates of transistors so as to form, on the one hand, NMOS transistors in the multilayer comprising the gate dielectric layer GHK and the second region of the metal layer GM2 and, on the other hand, PMOS transistors in the multilayer comprising the gate dielectric layer GHK and the first region of the metal layer GM1.

According to one aspect, the embodiments are not limited to the formation of NMOS and PMOS transistors; it is also possible to form two types of NMOS transistors having different electrical characteristics. The aluminum could, for example, be replaced by lanthanum, and a gate metal layer comprising titanium nitride, to form two NMOS transistors having different electrical characteristics.

Finally, other materials may be used for the metal layer, for example, a metal chosen within the group formed by aluminum, chrome, manganese, molybdenum, tungsten, tantalum, rhenium, ruthenium, cobalt, nickel, lanthanum, or an oxide of a metal from the group or a nitride of a metal from the group.

According to another aspect, transistors are obtained having a gate dielectric layer which is not damaged, since it is always protected.

The invention claimed is:

1. A method for forming at least two different gate metal regions of at least two MOS transistors comprising:
    forming a metal layer with first and second regions on a gate dielectric layer;
    forming a metal hard mask on the metal layer, the metal hard mask having a composition different from that of the metal layer, and covering the first region of the metal layer to define an intermediate structure and leaving open the second region of the metal layer;
    diffusion annealing the intermediate structure to make metal atoms of the metal hard mask diffuse into the first region of the metal layer, with the diffusion annealing being carried out in presence of a gaseous mixture comprising ammonia for nitriding the second region of the metal layer so as to increase a nitrogen concentration thereof; and
    removing the metal hard mask.

2. The method according to claim 1, wherein diffusion annealing comprises rapid thermal annealing.

3. The method according to claim 2, wherein the rapid thermal annealing is carried out for a duration in a range between 1 second and 5 minutes.

4. The method according to claim 2, wherein the rapid thermal annealing is carried out in a temperature range between 400° C. and 1200° C.

5. The method according to claim 1, wherein the metal layer comprises titanium nitride.

6. The method according to claim 1, wherein the metal hard mask comprises a metal selected from the group consisting of aluminum, chrome, manganese, molybdenum, tungsten, tantalum, rhenium, ruthenium, cobalt, nickel, lanthanum, or an oxide of a metal from the group or a nitride of a metal from the group.

7. A method for making an integrated circuit including at least two different gate metal regions of at least two MOS transistors, the method comprising:
    forming a metal layer with first and second regions on a gate dielectric layer above a substrate;
    forming a metal hard mask on the metal layer, the metal hard mask having a composition different from that of the metal layer, and covering the first region of the metal layer to define an intermediate structure and leaving open the second region of the metal layer;
    rapid thermal annealing the intermediate structure to make metal atoms of the metal hard mask diffuse into the first region of the metal layer, with the rapid thermal annealing being carried out in presence of a gaseous mixture comprising ammonia for nitriding the second region of the metal layer so as to increase a nitrogen concentration thereof; and
    removing the metal hard mask.

8. The method according to claim 7, wherein the rapid thermal annealing is carried out for a duration in a range between 1 second and 5 minutes in a temperature range between 400° C. and 1200° C.

9. The method according to claim 7, wherein the metal layer comprises titanium nitride.

10. The method according to claim 7, wherein the metal hard mask comprises a metal selected from the group consisting of aluminum, chrome, manganese, molybdenum, tungsten, tantalum, rhenium, ruthenium, cobalt, nickel, lanthanum, or an oxide of a metal from the group or a nitride of a metal from the group.

11. A method for making an integrated circuit including at least two different gate metal regions of at least two MOS transistors, the method comprising:

forming a metal layer with first and second regions on a gate dielectric layer;

forming a hard mask on the metal layer, the hard mask having a composition different from that of the metal layer, and covering the first region of the metal layer and leaving open the second region of the metal layer; and diffusing atoms of the hard mask into the first region of the metal layer, with the diffusion being carried out in presence of a gaseous mixture comprising ammonia for nitriding the second region of the metal layer so as to increase a nitrogen concentration thereof.

12. The method according to claim 11, wherein diffusing comprises performing a rapid thermal annealing.

13. The method according to claim 12, wherein the rapid thermal annealing is carried out for a duration in a range between 1 second and 5 minutes in a temperature range between 400° C. and 1200° C.

14. The method according to claim 11, wherein the metal layer comprises titanium nitride.

15. The method according to claim 11, wherein the metal hard mask comprises a metal selected from the group consisting of aluminum, chrome, manganese, molybdenum, tungsten, tantalum, rhenium, ruthenium, cobalt, nickel, lanthanum, or an oxide of a metal from the group or a nitride of a metal from the group.

* * * * *

UNITED STATES PATENT AND TRADEMARK OFFICE
CERTIFICATE OF CORRECTION

PATENT NO. : 9,437,498 B2  
APPLICATION NO. : 14/636778  
DATED : September 6, 2016  
INVENTOR(S) : Zoll et al.

Page 1 of 1

It is certified that error appears in the above-identified patent and that said Letters Patent is hereby corrected as shown below:

Title Page,  Line 1, replace "gates" with --gate--.
Item (57), Abstract

Signed and Sealed this  
Fifteenth Day of November, 2016

Michelle K. Lee  
*Director of the United States Patent and Trademark Office*